US006747879B2

United States Patent
Baker

(10) Patent No.: US 6,747,879 B2
(45) Date of Patent: Jun. 8, 2004

(54) HIGH POWER AMPLIFIER AND CHASSIS

(75) Inventor: Peter T. Baker, Lutherville, MD (US)

(73) Assignee: Andrew Corporation, Orlando Park, IL (US)

( * ) Notice: Subject to any disclaimer, the term of this patent is extended or adjusted under 35 U.S.C. 154(b) by 0 days.

(21) Appl. No.: 10/085,170

(22) Filed: Feb. 27, 2002

(65) Prior Publication Data

US 2002/0118520 A1 Aug. 29, 2002

Related U.S. Application Data

(60) Provisional application No. 60/271,967, filed on Feb. 28, 2001.

(51) Int. Cl.[7] .............................. H05K 9/00; H05K 7/14; H05K 7/18
(52) U.S. Cl. ........................ 361/818; 361/816; 361/800; 361/799; 361/753; 361/780; 361/794
(58) Field of Search .................. 361/816, 818, 361/800, 799, 753, 780, 794, 728, 736, 748, 752, 760, 761, 762, 763, 764, 790, 758; 174/35 R, 35 GC, 255, 261, 262

(56) References Cited

U.S. PATENT DOCUMENTS

| 4,658,334 A | 4/1987 | McSparran et al. | 361/415 |
|---|---|---|---|
| 4,717,989 A | 1/1988 | De Barros et al. | 361/424 |
| 4,868,716 A | 9/1989 | Taylor et al. | 361/424 |
| 4,872,090 A | 10/1989 | Taylor et al. | 361/424 |
| 4,889,959 A | 12/1989 | Taylor et al. | 174/35 |
| 5,107,404 A | 4/1992 | Tam | 361/424 |
| 5,250,845 A | 10/1993 | Runyan | 257/729 |
| 5,262,927 A | 11/1993 | Chia et al. | 361/784 |
| 5,434,750 A | 7/1995 | Rostoker et al. | 361/784 |
| 5,550,713 A * | 8/1996 | Pressler | 361/818 |
| 5,566,055 A | 10/1996 | Salvi, Jr. | 361/816 |
| 5,587,920 A | 12/1996 | Muyshondt et al. | 364/489 |
| 5,594,626 A | 1/1997 | Rostoker et al. | 361/784 |
| 5,719,750 A * | 2/1998 | Iwane | 361/794 |
| 5,729,183 A | 3/1998 | Schuchmann et al. | 333/1 |
| 5,790,383 A | 8/1998 | Imagawa | 361/760 |
| 5,808,529 A | 9/1998 | Hamre | 333/246 |
| 6,057,733 A | 5/2000 | Donaldson et al. | 330/151 |
| 6,084,779 A | 7/2000 | Fang | 361/763 |
| 6,094,350 A * | 7/2000 | Achiriloaie | 361/737 |

* cited by examiner

Primary Examiner—Phuong T. Vu
(74) Attorney, Agent, or Firm—Wood, Herron & Evans, LLP

(57) ABSTRACT

A power amplifier assembly combines a single printed circuit board with a housing for providing isolation between subcircuits of the circuit board. The printed circuit board is provided with four conductive layers and contains a power supply subcircuit, an upconverter subcircuit, a monitor and control subcircuit, a low power gain subcircuit, and a high power gain subcircuit. The printed circuit board is further provided with plated-through vias in an isolation path which, in conjunction with internal chassis lid walls, serves to increase electromagnetic and radio frequency isolation between subcircuits on the printed circuit board.

17 Claims, 7 Drawing Sheets

HIGH POWER AMPLIFIER AND CHASSIS

RELATED APPLICATIONS

This application claims the filing benefit and priority of U.S. Provisional Application entitled "A Low Cost Compact High Power Amplifier and Chassis," Ser. No. 60/271,967, filed Feb. 28, 2001, and incorporates that application by reference herein in its entirety.

FIELD OF THE INVENTION

The present invention relates generally to high power amplifiers and specifically to a high power amplifier assembly having a single printed circuit board capable of housing and isolating a plurality of subcircuits.

BACKGROUND OF THE INVENTION

Modern high power amplifiers, such as those for cellular communications, do more than simply amplify a signal. Such power amplifiers also handle other tasks as well. For example, high power amplifiers often must also condition or change input prime power from one voltage to another voltage for proper operation of the internal amplification circuits. Furthermore, such amplifiers may be required to translate an incoming frequency to a different frequency.

Another operation many high power amplifiers perform is the monitoring of internal circuit functionality and the transmission of that monitoring information across an external data bus. Still further, high power amplifiers may be required to receive external operating instructions as well.

Currently, to properly provide such disparate operations and functions, existing high power amplifiers include numerous, separate printed circuit assemblies, which are often mounted and housed individually. For example, a separate board assembly for each function is common in existing amplifier designs. The assemblies both contain and electrically isolate the various individual circuit assemblies. In such designs, each function is handled by its own separate printed circuit assembly which is mounted its own housing. With each function handled by stand-alone circuits, the various circuit assemblies then must be individually assembled and ultimately joined into a single, completed assembly.

As may be appreciated, current power amplifier designs result in multiplication of numerous manufacturing steps, thus increasing production costs. Furthermore, the separate handling required for each separate circuit adds additional costs. For example, each separate board assembly for each of the various functions must be separately kitted, assembled, cleaned and inspected. Often, several of these subassemblies are also tested prior to top level assembly and must be again retested once top level assembly occurs.

Additionally, discrete circuit connection components must be used to interconnect the various separate subassemblies and transmit signals from one subassembly to the next. The interconnection components and assembly further add complexity and cost to the design and production of the amplifier. The reliability of the overall structure is reduced as well, due to the multiple individual components for interconnection.

Still further, the size of such amplifiers is dictated by the amount of space necessary to incorporate and assemble all of the individually housed subassemblies together. Therefore, existing amplifiers often do not efficiently address size and space issues.

There exists a need for a high power amplifier which reduces the component manufacturing and production costs while increasing the reliability and maintaining the desired isolation of the high power amplifier within a compact assembly size.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF EMBODIMENTS OF THE INVENTION

Figure 1A:
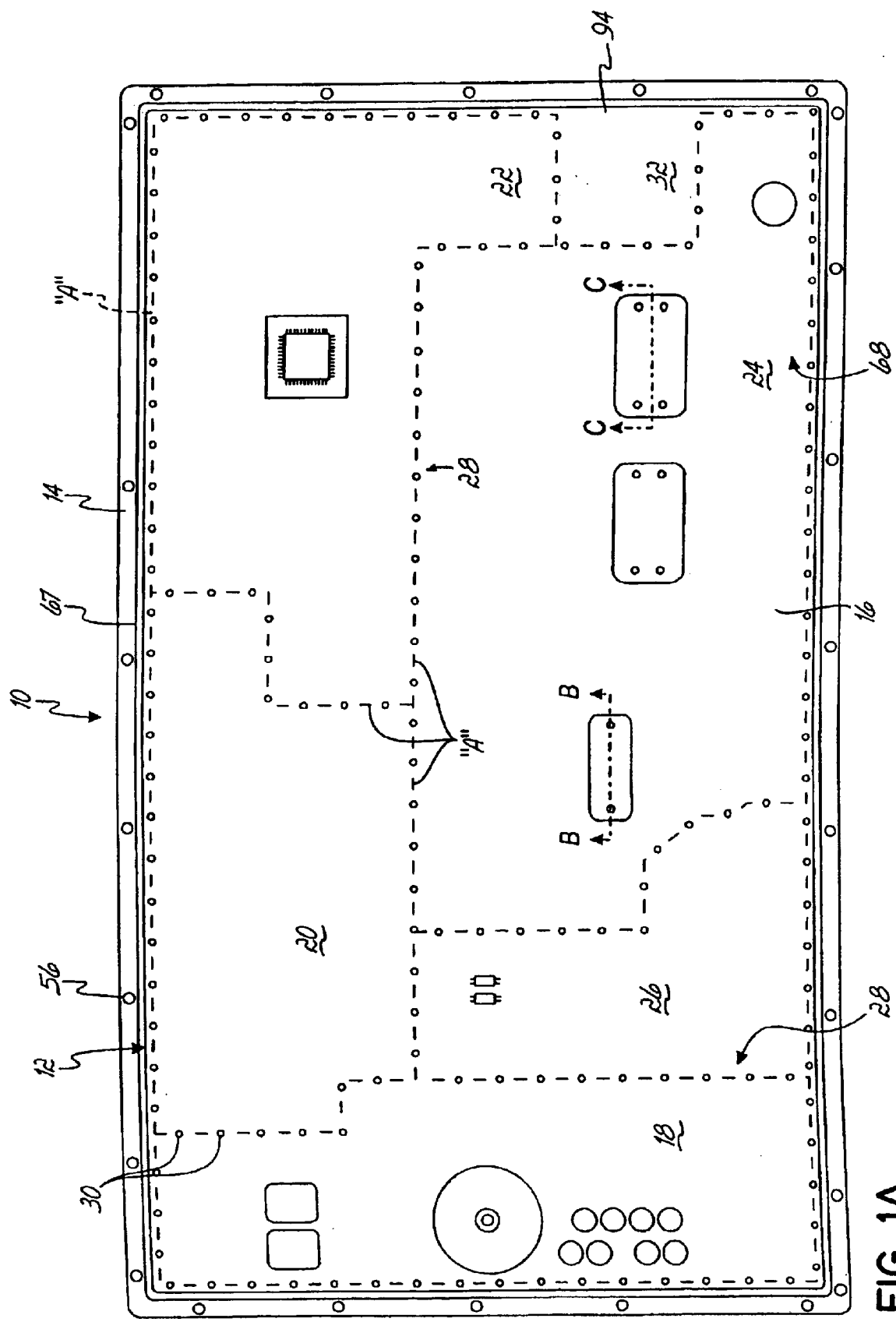
FIG. 1A is a top view of a high power amplifier in accordance with one embodiment of the present invention.
Figure 3A:
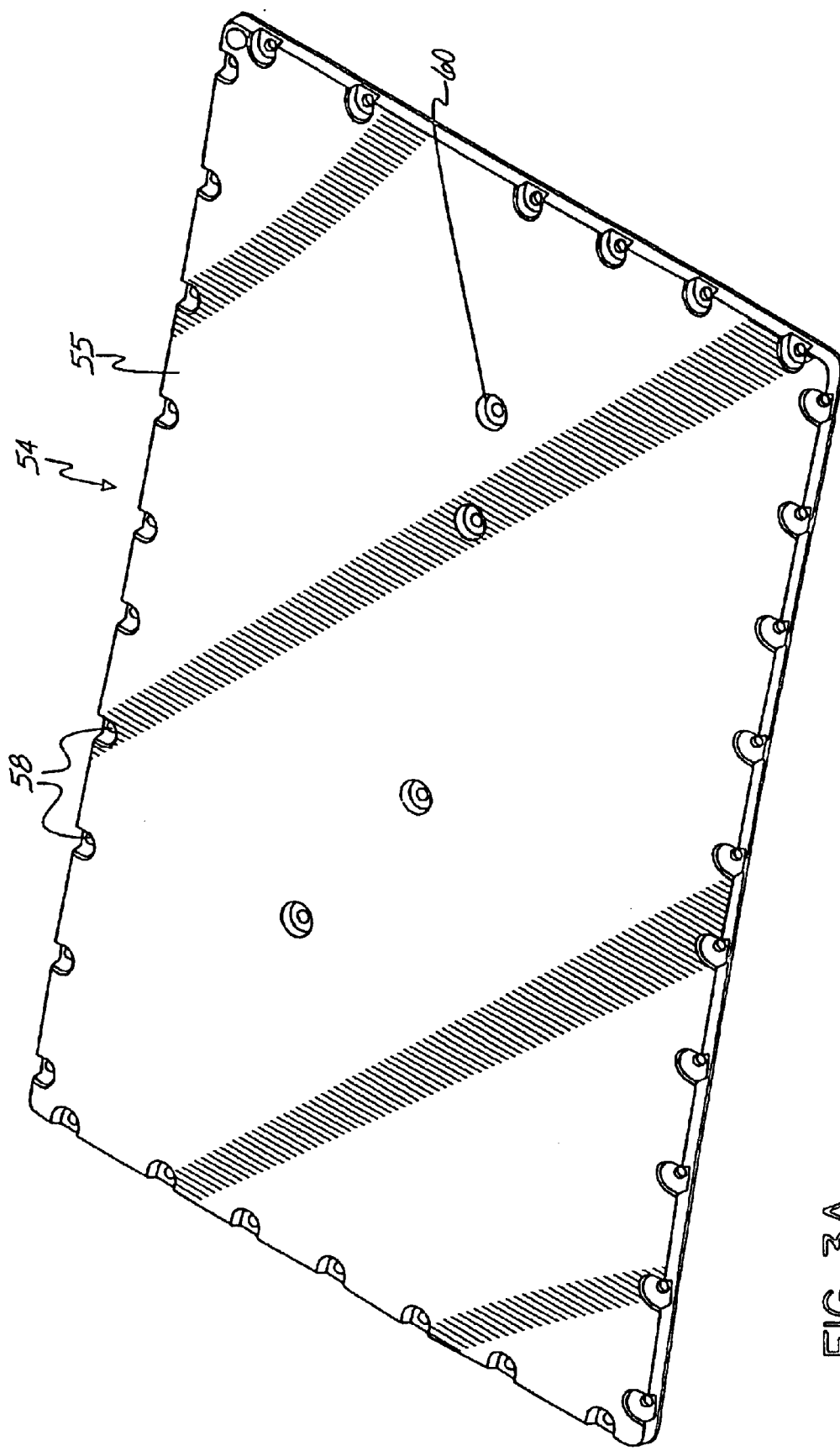
FIG. 3A is a perspective view of a top side of a chassis lid according to one embodiment of the present invention.

Referring to FIG. 1A, a power amplifier assembly 10 of one embodiment of the present invention is shown and includes a single printed circuit board 12 and a chassis, including a chassis base or body 14, and a lid or lid structure 54. The chassis body, in combination with a lid structure or lid 54 (FIGS. 3A and 3B) is configured so that a single printed circuit board 12 contains multiple and functionally different subcircuits, which are shielded from undue electromagnetic (EM) and/or radio frequency (RF) interference and noise. Undue interference and noise is defined as interference and noise above a level currently tolerated in assemblies using multiple printed circuit boards, or noise which unacceptably reduces the ability of the power amplifier assembly 10 to function properly. In addition, the chassis formed by the lid 54 and the chassis body 14 provides a single ground reference for all signals in the power amplifier assembly 10, thereby reducing the number of discrete wiring components. Still further, the entire assembly is housed within a single chassis or housing.

In one embodiment, the power amplifier assembly is adapted to amplify radio frequency (RF) signals. Currently, as discussed above in the Background Section, high power amplifiers are also required to do a number of additional functions. As noted, these functions are traditionally performed in existing amplifier designs by using a series of separate printed circuit boards, each having specialized components and housing requirements. However, by using the power amplifier assembly 10 of the present invention, shielding is provided in component selection and lid compartmentalization to reduce the interference, allowing for the use of a single printed circuit board and a single housing instead of multiple printed circuit boards and separate housings. In accordance with aspects of the invention, this is accomplished through a combination of the arrangement of the components on the printed circuit board 12, the use of ground planes within the printed circuit board 12, and the use of extensive shielding in the lid and common grounding in the housing. These various aspects and other aspects are discussed below in reference to FIGS. 2–5.

Figure 4A:
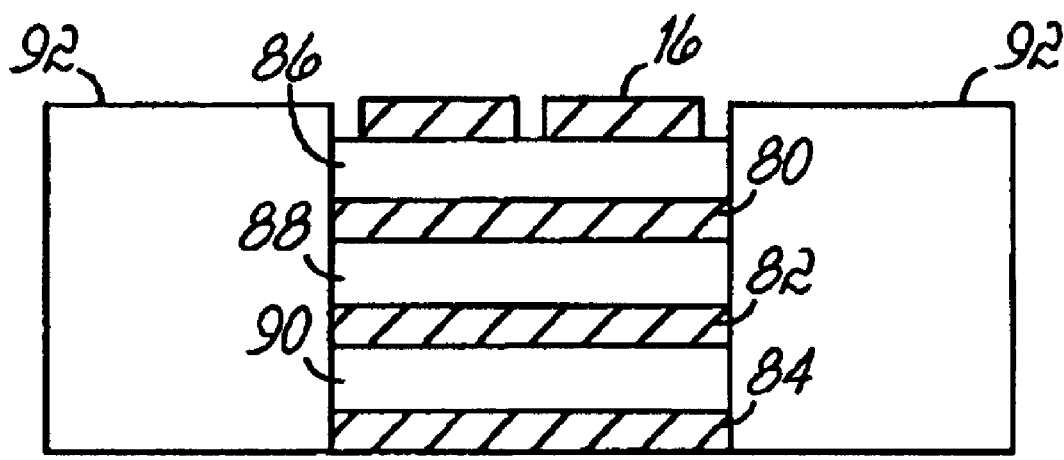
FIG. 4A is a side view in partial cross-section of a portion of a printed power amplifier circuit board according to one embodiment of the present invention.
Figure 4B:
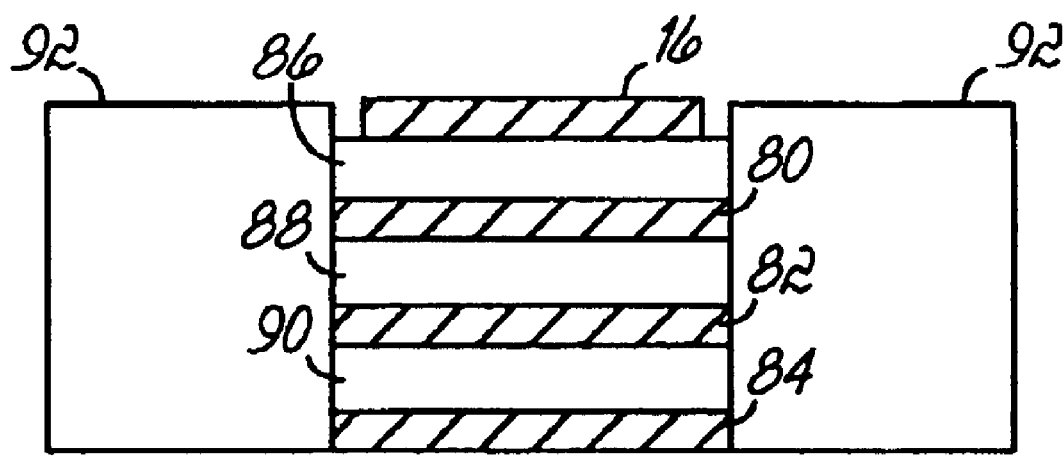
FIG. 4B is a side view in partial cross-section of another portion of a printed power amplifier circuit board according to one embodiment of the present invention.

FIG. 1A illustrates a top view of a printed circuit board 12 inside a chassis body 14 with circuit components extending upwardly from a first conductive layer 16 of the printed circuit board 12 (other layers of the printed circuit board are visible in FIGS. 4A and 4B). In one embodiment, the various circuit components are arranged into groups or subcircuits which are positioned on the board 12 and perform various functions for the power amplifier assembly 10. These subcircuits are separated by the dotted lines indicated as "A" in FIGS. 1A and 1B, which form various ground isolation paths.

In one embodiment of the present invention, the printed circuit board 12 includes a power supply subcircuit 18, an upconverter subcircuit 20, a monitor and control subcircuit 22, a high power gain subcircuit 24, and a low power gain subcircuit component 26. It is also contemplated that the high power gain subcircuit 24 be on the printed circuit board with any combination of these circuits. Although a particular layout and arrangement of subcircuits is shown in FIG. 1A, it is to be understood that the principles of the present invention may be used with alternative subcircuit layouts.

The power supply subcircuit 18 acts to provide the other subcircuits on the printed circuit board 12 with power. The power supply subcircuit 18 is separated from the other components by an isolation path 28. An isolation path may be defined as a printed strip of grounded circuit, which is dotted by a plurality of plated-through vias 30, as discussed further below. The isolation path 28 acts in conjunction with the internal chassis lid walls 64 (shown in FIG. 3B) to electrically isolate the circuitry of each subcircuit on the printed circuit board 12 from EM and/or RF interference from the other subcircuit components.

When the power supply subcircuit 18 is placed on the printed circuit board with the high power gain subcircuit 24, it is desirable that the two components be placed away from each other in order to minimize magnetic interaction between the subcircuits that penetrates the chassis. In the embodiment shown in FIG. 1A, the power supply subcircuit 18 and the high power gain subcircuit 24 are shown with the low power gain subcircuit 26 positioned between them. In an embodiment where the power supply subcircuit 18 and the high power gain subcircuit 24 are the only two subcircuits to be included on a single printed circuit board 12, the two subcircuits may have to be isolated by the inclusion of "Mu-metal," a ferrous alloy that magnetic fields cannot penetrate. Desirably, switching noise from the power supply subcircuit 18 should not show up as side bands on the output spectrum greater than –65 dB relative to the main signal.

The upconverter subcircuit 20 incorporates circuitry to convert RF signals from a lower frequency to a higher frequency. In one embodiment, the upconverter subcircuit 20 upconverts a signal between about 870 MHz and about 890 MHz to a signal between about 1930 MHz and about 1990 MHz signal. That signal is then amplified from about 125 microwatts to about 400 microwatts. The upconverter subcircuit 20 is also preferably separated from the power supply subcircuit 18 by the isolation path 28 and the internal chassis lid walls 64.

The monitor and control subcircuit 22 monitors the output of the other subcircuits to ensure that the subcircuits are operating correctly. The monitor and control subcircuit 22 may compare the other subcircuits' monitoring circuit signals against preset values. If the outputs do not match the preset values, the monitor and control subcircuit 22 may adjust signal levels within other subcircuits and/or within the monitor and control subcircuit until the output value and preset value match, for example, utilizing software closed circuit feedback in one embodiment. In one embodiment, the monitor and control subcircuit 22 is also separated from the other subcircuits by the isolation path 28 in conjunction with the internal chassis lid walls 64.

The low power gain subcircuit 26 performs a first amplification step, to a level of about 400 milliwatts, on signals coming from the upconverter. The high power gain subcircuit 24 performs a second amplification step to about 60 watts, which is delivered to an output connector of the power amplifier assembly 10. The high power gain subcircuit 24 is also surrounded by the isolation path 28 and the internal chassis lid walls 64. An output power detector subcircuit 32 serves to monitor the output of the printed circuit board 12. The output power detector subcircuit 32 forwards this output power information to the monitor and control subcircuit 22. In one embodiment, the output power detector subcircuit 32 includes an integrated circuit manufactured by Analog Devices (part number AD8314).

By placing the power supply subcircuit 18, the upconverter subcircuit 20, the monitor and control subcircuit 22, the high power gain subcircuit 24, and the low power gain subcircuit 26 on a single printed circuit board 12, a variety of efficiencies are achieved. For example, excess input and output circuitry and connectors are eliminated because the connections between the various subcircuits may be made on or through the printed circuit board 12 itself. Further, in accordance with one aspect of the invention and using the isolation path 28, lid walls 64, and the EM and RF isolation techniques of the present invention, separate housings for each subcircuitry are not necessary. This represents significant material and assembly cost savings by eliminating multiple housings. EM and RF isolation equal to that achieved by using separate subcircuits within separate housings may be achieved using the present invention. Because only one unit has to be manufactured and tested, manufacturing costs are significantly reduced and product reliability is increased utilizing the present invention.

Figure 1B:
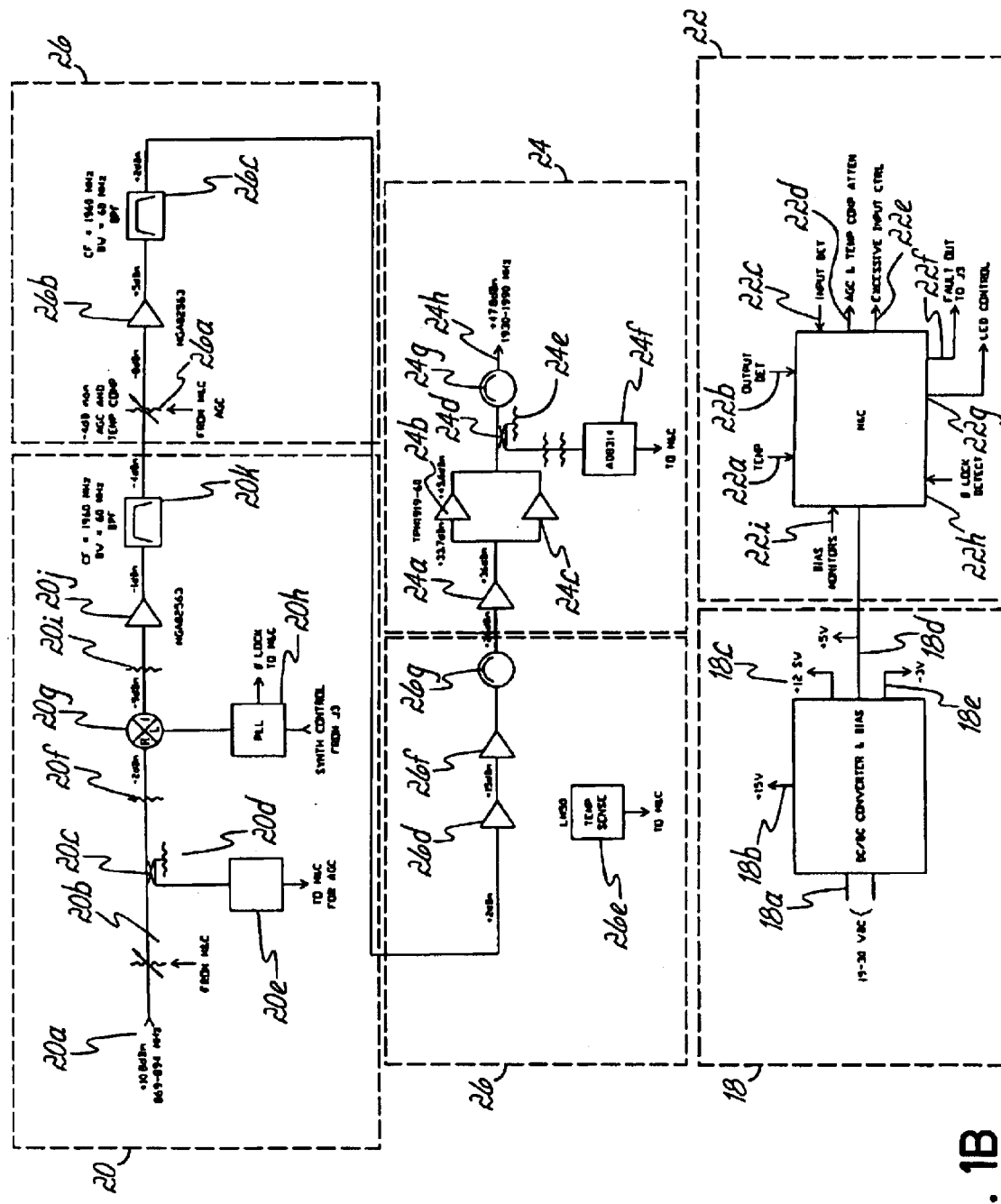
FIG. 1B is a schematic circuit diaphragm of a high power amplifier of one embodiment of the present invention.

Turning now to FIG. 1B, a block diagram of a high power amplifier circuit for use in one embodiment of the present invention is shown. The subcircuit components are numbered and lettered to indicate their respective subcircuits. Various values are set forth herein for embodiments of the invention, but are not meant to be limiting. The upconverter subcircuit 20 includes an input 20a for accepting a signal between about 869 and about 894 MHz at a power of about 10.8 dBm. An excessive input level attenuator 20b receives signals from the monitor and control subcircuit 22 to keep power levels at or below a nominal 9 dBm. The attenuator's nominal attenuation is 2 dB. A 15 dB coupler 20c sends an input power diagnostic signal through an integrated input power detector circuit 20e to the monitor and control subcircuit 22 for automatic gain control. FIG. 1B shows a termination 20d, and in one embodiment a 50 ohm termination is used. A pre-mixer attenuator 20f attenuates the signal before the signal enters an upconverter mixer 20g and provides the upconverter mixer 20g with a good 50 ohm source. In one embodiment, the pre-mixer attenuator attenuates approximately –11 dB.

The upconverter mixer 20g accepts the attenuated Intermediate Frequency (IF) signal and an LO signal from a phase-locked loop (PLL) synthesizer 20h to produce a radio frequency (RF) output. The PLL synthesizer 20h receives a synthesizer control signal from assembly connector J3 and forwards a "phase lock" monitor signal to the monitor and control subcircuit 22. The RF output from the upconverter mixer 20g is attenuated by a post-mixer attenuator 20i which serves to provide a 50 ohm load to the upconverter mixer 20g. The attenuated signal feeds an upconverter gain stage 20j. In one embodiment, the post-mixer attenuator 20i attenuates at about −5 dB and the upconverter gain stage 20j is circuit model number MGA82563 manufactured by Agilent Corporation. Following the upconverter gain stage 20j, the signal enters an upconverter band pass filter 20k. In one embodiment, the upconverter band pass filter 20k has a center frequency of about 1960 MHz and a band width of about 60 MHz, and attenuates in-band signals at about −3 dB. Of course, other suitable components with different operating parameters may be utilized without deviating from the present invention.

The output signal from the upconverter subcircuit 20 next enters the low power gain subcircuit 26, where it is attenuated by an automatic gain control and temperature compensation attenuator 26a, which attenuates in response to signals from the monitor and control subcircuit 22 at a nominal −4 dB. The attenuated signal then enters a first low power gain stage 26b. In one embodiment, the first low power gain stage is circuit model number MGA82563 manufactured by Agilent Corporation and it amplifies the incoming signal at about +13 dB. Next, the signal enters a band pass filter 26c. In one embodiment, the low power gain band pass filter 26c has a center frequency of about 1960 MHz, a band width of about 60 MHz, and attenuates in-band at about −3 dB.

The signal then enters a second low power gain stage 26d. In one embodiment, the second low power gain stage 26d is circuit model number FLU10XM manufactured by the Fujitsu Corporation and it amplifies the incoming signal at about +13 dB. A temperature sensor circuit 26e may send a temperature signal corresponding to the temperature of the low power gain subcircuit to the monitor and control subcircuit 22. In one embodiment, the temperature sensor circuit 26e is circuit model number LM50 manufactured by National Semiconductor. Following the second low power gain stage 26d, the signal enters a third low power gain stage 26f. In one embodiment, the third low power gain stage 26f is circuit model number FLU35XM manufactured by the Fujitsu Corporation, and it amplifies the incoming signal at about +11 dB. In one embodiment, a low power gain circuit isolator 26g is provided before the output of the low power gain subcircuit 26 in order to provide a 50 ohm load to the third low power gain stage 26f, as well as a 50 ohm source to the high power gain subcircuit 24.

The signal exiting the low power gain subcircuit 26 enters the high power gain subcircuit 24 and is amplified by a first high power gain stage 24a. In one embodiment, the first high power gain stage 24a is circuit model number FLL400IP-2 manufactured by the Fujitsu Corporation, and it amplifies the incoming signal at about +10 dB. The output of the first high power gain stage 24a is input into second and third high power gain stages 24b and 24c, which are coupled together in parallel. In one embodiment, the second and third high power gain stages 24b and 24c are circuit model number TPM1919-60 manufactured by the Toshiba Corporation each amplifying the incoming signal at about +12 dB, including losses in a power splitter and combiner. The output signal from the second and third high power gain stages 24b and 24c may be detected through the use of a 28 dB detection coupler 24d, with an associated detection coupler attenuator. In one embodiment, the detection coupler is provided with attenuators which attenuate at about 41 dB. The detection coupler 24d is shown with a 50 ohm termination 24e. An output detector circuit 24f (which is part of the output power detector subcircuit 32) reads the power at this point and sends an output power signal to the monitor and control subcircuit 22. The output power detector circuit 24 may be preceded by attenuators, and in one embodiment, a first output power attenuator attenuates at about −5 dB, and a second output power attenuator attenuates at about −36 dB. The signal form the second and third high power gain stages 24b and 24c passes through an isolator 24g before exiting the circuit at the output 24h.

FIG. 1B also shows a block diagram of the power supply subcircuit 18 and the monitor and control subcircuit 22, with arrows and lines showing various inputs and outputs of these two subcircuits. The power supply subcircuit 18 includes power supply inputs 18a, providing between about 19 DC volts and about 30 DC volts, a continuous +15V DC output 18b, a switched +12V DC output 18c (controlled by the monitor and control subcircuit 22), a continuous +5V DC output 18d, and a continuous −3V DC output 18e. The +5V DC output 18d is the power input into the monitor and control subcircuit 22.

The monitor and control subcircuit 22 includes a temperature signal input 22a, which receives signals from the temperature sensor 26e, an output detector signal input 22b, which receives signals from the output detector circuit 24f, and an input detector subcircuit 22c, which receives signals from the input power detector circuit 20e. The monitor and control subcircuit 22 further includes an automatic gain control and temperature control attenuator output 22d, which sends signals to the automatic gain control and temperature compensation attenuator 26a; an excessive input control output 22e, which sends signals to the excessive input level attenuator 20b; a fault output 22f, which sends fault signals to connector J3; an LED control output 22g, which controls LED indicators; and a phase lock detector input 22h, which receives signals from the PLL synthesizer 20h. Bias monitors 22i may also be provided in the monitor and control subcircuit 22, to monitor voltages within the power supply subcircuit 18. The monitor and control circuit 22 may disable the amplifier 10 when a bias monitor goes out of a predetermined range.

Figure 2A:
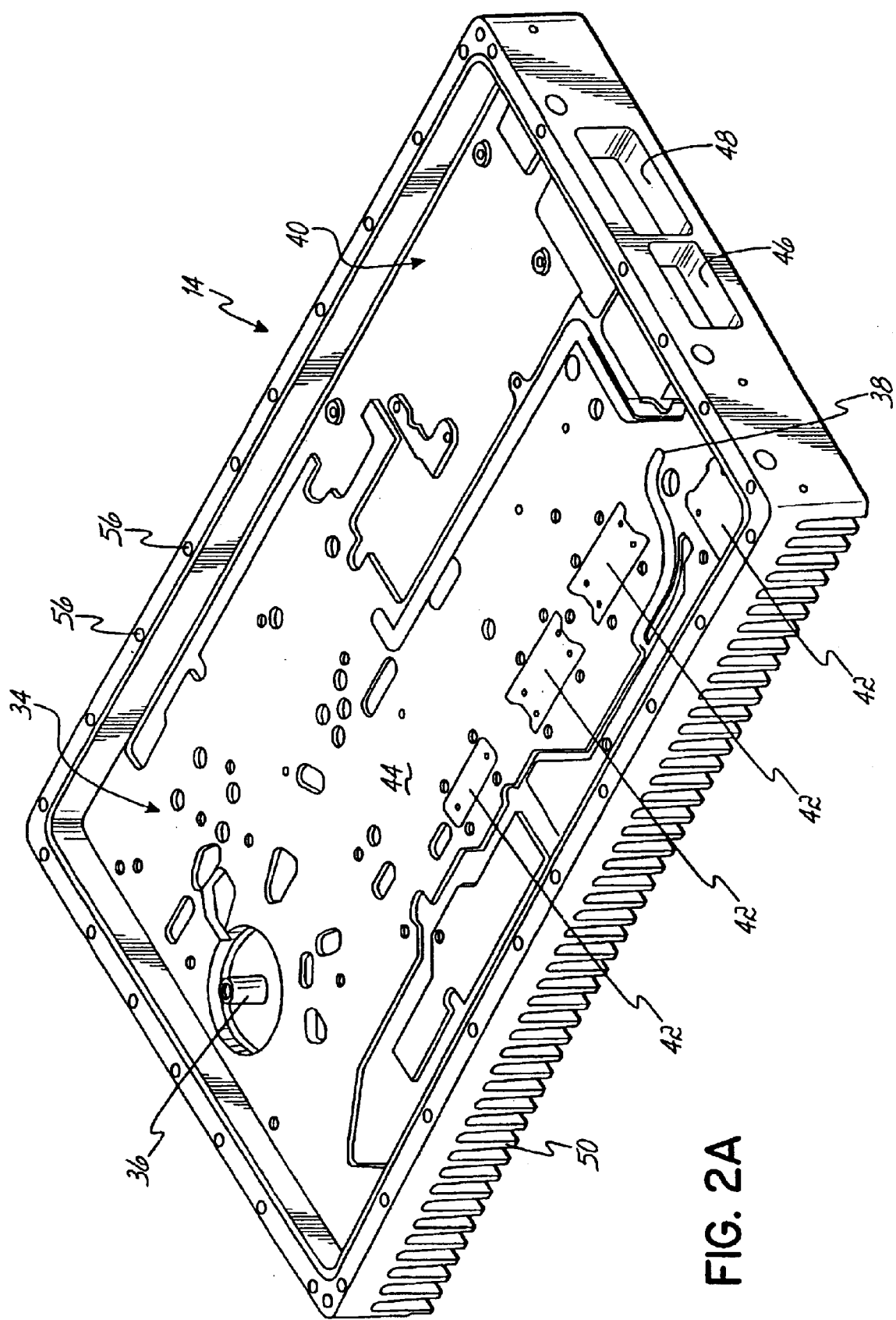
FIG. 2A is a perspective view of a top side of a chassis body according to one embodiment of the present invention.
Figure 2B:
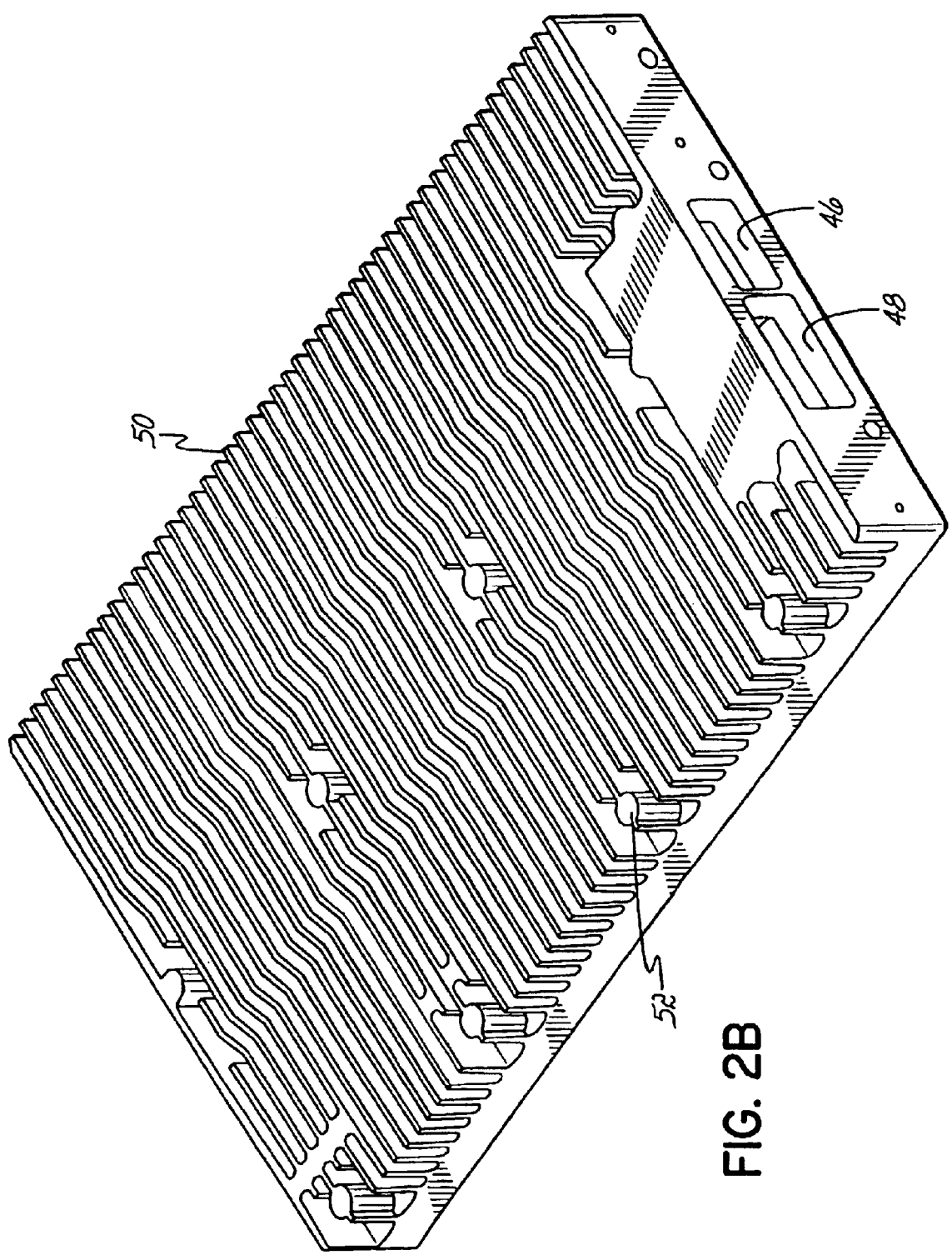
FIG. 2B is a perspective view of a bottom side of a chassis body according to one embodiment of the present invention.

Turning now to FIG. 2A, a perspective view of a top side 34 of a conductive chassis body 14 according to one embodiment of the present invention is shown. In one embodiment, the chassis body 14 is cast out of aluminum and is electrically conductive. Other materials may be used for the chassis body 14, such as copper, bronze or brass. Further, the chassis body 14 may be formed using other methods, such as milling. In accordance with one aspect of the present invention, a number of structures are formed in the chassis body 14. For example, a support boss 36 is provided to support a toroidal inductor, such as may be included in the power supply subcircuit 18. Further, a variety of channels or depressions may be formed along the conductive top side 34 of the chassis body. One such channel is a power detector coupling channel 38 for a coupled output signal feeding the output power detector subcircuit 32. Another channel is a monitor and control subcircuit pocket 40, which provides clearance for many signal paths in the monitor and control subcircuit 22, as well as for prime power feeding the power supply subcircuit 18. The chassis body is grounded and provides a good ground reference for the amplifier assembly 10.

A number of circuit component pockets 42 may also be provided along the top side 34 of the chassis body 14. In one embodiment, the circuit component pockets 42 are provided for flange-mounted power transistors extending downwardly from the printed circuit board 12 past its mating surface with the chassis body 14. In one embodiment, the circuit component pockets are about 13 mils deep from a main surface 44 of the chassis body top side 34. External connector paths 46 and 48 are provided to allow signal connections into and out of the power amplifier assembly 10. In one embodiment, external connector paths 46 and 48 are inputs, with additional pins provided on a connector into the connector path 46 for outputs. Other RF signal paths may be provided, such as a 15 MHz reference input for the upconverter subcircuit 20, a 900 MHz input, and a 1900 MHz output. Cooling fins 50 may also be provided as part of the chassis body 14 to dissipate heat from the power supply subcircuit 18, the high power gain subcircuit 24, and the other subcircuits on the printed circuit board 12. The cooling fins 50 are more clearly seen in FIG. 2B, which also shows cooling fin casting ejector pads 52, for use when pushing a cast chassis body 14 out of its die.

The chassis body 14 works in conjunction with a chassis lid 54, (shown in FIG. 3A, which provides a perspective view of a top side 55 of the chassis lid 54) to provide protection and EM and RF shielding to the various subcircuits of the power amplifier assembly 10, in accordance with one aspect of the present invention. The chassis body is provided with a number of chassis lid attachment holes 56 for a secure connection between the chassis lid 54 and the chassis body 14. In one embodiment, the chassis lid attachment holes 56 accommodate thread-forming attachment screws which fit through edge attachment through holes 58 provided in the chassis lid 54. Central attachment through holes 60 may also be provided in the chassis lid 54 to support the chassis lid 54 and to ensure that gasketing material dispensed on the internal chassis lid walls 64 stays in contact with the printed circuit board 12 for desirable electrical isolation between the subcircuits.

Figure 3B:
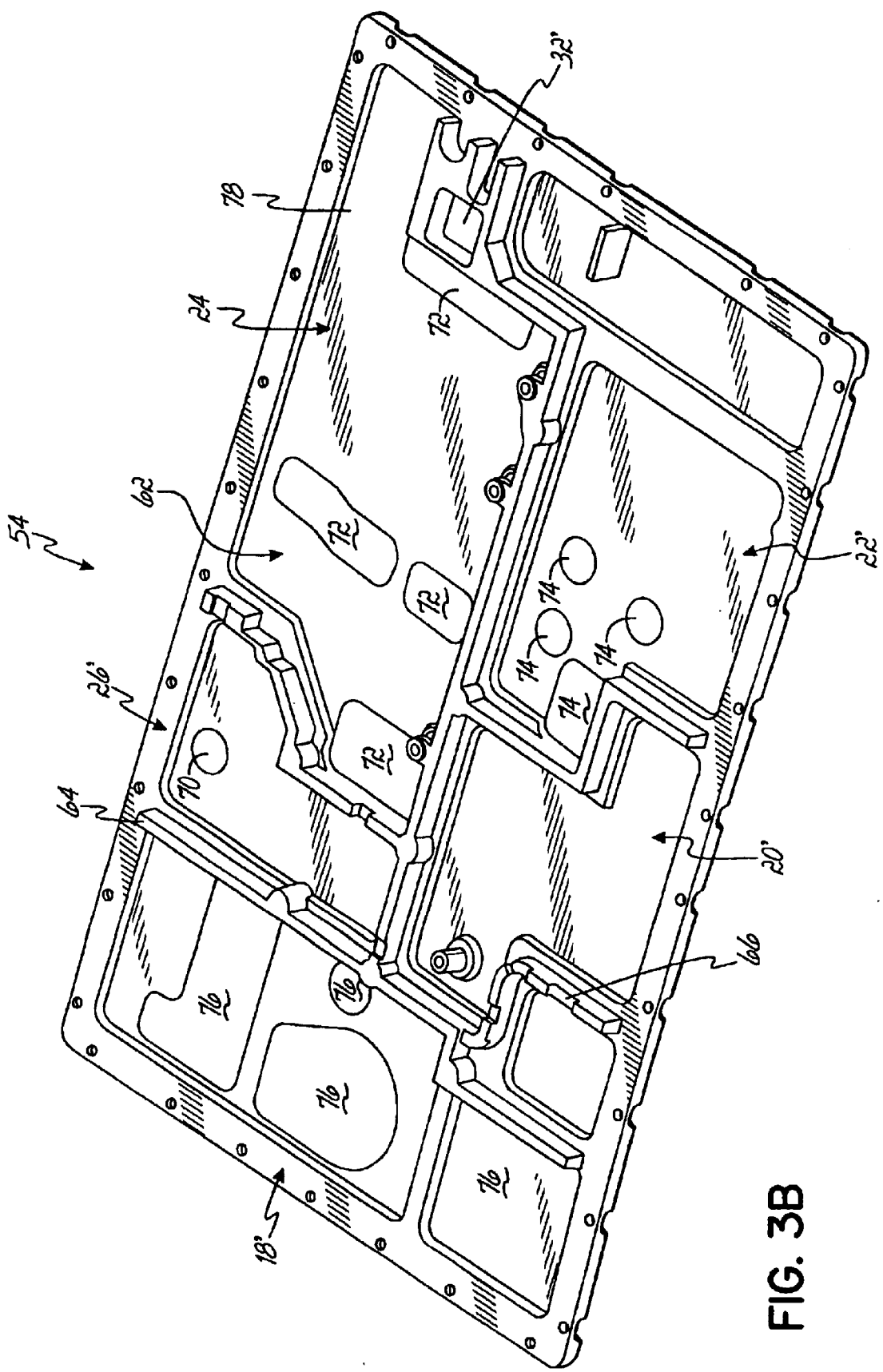
FIG. 3B is a perspective view of a bottom side of a chassis lid according to one embodiment of the present invention.

Turning now to FIG. 3B, a perspective view of a bottom side 62 of the chassis lid 54 illustrates a number of subcircuit cavities adapted to surround and protect the various subcircuits on the printed circuit board 12 and to provide EM and RF isolation between the subcircuits. The subcircuit cavities are formed by internal chassis lid walls 64 in conjunction with side walls 67 of the chassis body 14 (FIG. 1A). The walls 64 generally extend downwardly from the lid. The internal chassis lid walls 64 are provided with various chassis lid wall pathways 66 wherever connections between subcircuits are made along a top side 68 (FIG. 1A) of the printed circuit board 12. Subcircuit cavities are provided by the walls to electrically isolate subcircuits which require isolation, and are numbered in agreement with the numbering of their associated subcircuits that they isolate. The shown subcircuit cavities in the disclosed embodiment include a power supply subcircuit cavity 18', an upconverter subcircuit cavity 20', a monitor and control subcircuit cavity 22', a high power gain subcircuit cavity 24', a low power gain subcircuit cavity 26', and an output power detector subcircuit cavity 32'.

When the amplifier of the present invention is assembled, the lid 54 is coupled with circuit board 12 and chassis body 14 to form the subcircuit cavities. The walls 67 contact board 12 around the defined boundaries of the subcircuits. The walls 67 generally coincide with the ground isolation paths 28. Each of the subcircuits is thereby separately contained and isolated on a single board and using a single lid and chassis body.

A number of clearance areas may also be provided on the bottom side 62 of the chassis lid 54. For example, a low power gain component clearance area 70 may be provided to allow clearance for tall components in the low power gain subcircuit 26. Further, high power gain component clearance areas 72 may be provided to allow clearance for tall components in the high power gain subcircuit cavity 24', monitor and control component clearance areas 74 may be provided to allow clearance for tall components in the monitor and control subcircuit cavity 22', and power supply component clearance areas 76 may be provided to allow for clearance of tall components in the power supply subcircuit cavity 18'. In one embodiment, the clearance areas are set off by approximately 30 mils from a main surface 78 of the bottom side 62 of the inner lid 54, though greater or lesser clearances may be utilized depending on the size of the component to be cleared.

In one embodiment, to further enhance the electrical isolation of the cavities, a soft, electrically-conductive, form-in-place gasket is dispensed on internal chassis lid walls 64 to take up gaps between the internal chassis lid walls 64 and the printed circuit board 12 and paths 28 where the walls and board contact. These gaps may not be tightly controlled, resulting from manufacturing mechanical tolerances in the printed circuit board 12, the chassis lid 54, and the chassis body 14. In one embodiment, the chassis lid walls 64 are shortened by about 35 mils to allow room for a 65 mil gasket, which is then compressed to ensure a tight EMI shield from one subcircuit cavity to the next when the lid and chassis body are coupled together.

Turning now to FIG. 4A, a cutaway side view of a printed circuit board 12 of one embodiment of the present invention is shown. The cutaway side view in FIG. 4A is taken along the cutaway lines "B" in FIG. 1A. Likewise, the cutaway side view in FIG. 4B is taken along the cutaway lines "C" in FIG. 1B. In one embodiment of the present invention, a four-layer design is utilized to produce a multilayer, printed circuit board. In other embodiments, circuit boards having more or fewer layers than four are possible. For example, two-layer circuit boards or six-layer circuit boards may be used in some embodiments.

In the embodiments shown in FIGS. 4A and 4B, the first conductive layer 16 and a second conductive layer 80 of the printed circuit board 12 are on opposite sides of a first dielectric layer 86. In one embodiment, the second conductive layer 80 and a third conductive layer 82 are separated by a second dielectric layer 88. Similarly, the third conductive layer 82 and a fourth conductive layer 84 are on opposite sides of a third dielectric layer 90.

In one embodiment, the first dielectric layer 86 is a controlled-dielectric manufactured by the Rogers Corporation, model number RO-4350, the third dielectric layer 90 is a dielectric manufactured by the Isola Corporation such as model numbers FR406 or FR408 and the conductive layers are copper. The second dielectric layer 88 is FR-4 prepreg, used for laminating other materials together. Copper clad FR406 or FR408 has a coefficient of thermal expansion that is compatible with RO-4350 dielectric, and the two materials are designed to have similar environmental and processing characteristics so that they may be laminated together for long-term application as a multilayer board. It is also contemplated that the third dielectric layer 90 be manufactured of Rogers Corporation RO-4350 material.

The cutaway of FIG. 4A shows a section of the printed circuit board 12 where the first conductive layer 16 is provided with a break for forming multiple conductive leads. The cutaway of FIG. 4B shows a section of the printed circuit board 12 where the first conductive layer 16 is continuous for forming a single lead. Also shown in FIGS. 4A and 4B are edge plated areas 92, where conductive material is plated through the entirety of the vertical dimension of the cutaway area to provide sufficient grounding interconnect between the layers from the chassis.

The first conductive layer 16 is populated with surface mount components and contains controlled impedance circuits necessary for proper operation of certain components. The layer 16 includes various RF signal paths for the components. The first conductive layer 16 also contains ground planes which act as shields, in conjunction with the internal chassis lid walls 64 for minimization of interference between the various subcircuits on the first conductive layer 16. The second conductive layer 80 is a ground plane, which completes the controlled impedance circuits. The ground plane also acts as a shield, for minimization of interference between the first layer 16 signals and third layer 82 signals. The third conductive layer 82 distributes various signals, such as conditioned voltage and monitoring signals through the printed circuit board. Finally, the fourth conductive layer 84 is nearly completely metallized, and also acts as a ground plane to transfer ground from the chassis body 14 to the printed circuit board 12.

A plurality of plated vias 30, as shown in FIG. 1A, are liberally dispersed around the four conductive layers 16, 80, 82, and 84. The plated vias 30 are copper-plated therearound and used to carry signals or ground from layer to layer. When used for grounding, the vias 30, help ensure a proper ground at all layers by providing connections between all of the ground planes of the first, second, third, and fourth conductive layers 16, 80, 82, and 84. Further, vias 30 are aligned in various patterns as shown in FIG. 1A to form the ground isolation paths 28 which, in conjunction with the internal chassis lid walls 64, serve to electrically isolate the subcircuits on the printed circuit board 12. The plated vias 30 forming isolation paths 28 are positioned such that the internal chassis lid walls 64 make electrical contact with the plated vias for desirable grounding characteristics.

To further ensure a proper ground level at all layers, the printed circuit board 12 includes a perimeter 94 that is also plated. The perimeter 94 may be plated with copper or another conductive material. The perimeter 94 thus brings ground up from the main surface 44 of the chassis base 14 to each conductive layer 16, 80, 82, and 84 of the printed circuit board 12. The presence of ground planes throughout the printed circuit board 12, in conjunction with plated vias 30 and the internal chassis lid walls 64, provides the desired shielding of the components which reduces the ability of incompatible signals to corrupt each other.

In one embodiment of the present invention, board layout and circuit design are performed concurrently so that signals may be routed without interruption. Further, all circuits are preferably designed to operate on a common board material, such as board material model number RO-4350 manufactured by the Rogers Corporation. According to one embodiment, ground planes are necessary in certain areas for circuit functionality, particularly in circuits with controlled impedances such as in amplification sections and an output power coupler feeding the output power detector subcircuit 32. Functionality of an amplifier may be improved under the present invention because certain circuits, particularly monitor circuits, may be spread to functionally different areas of the printed circuit board 12. In one embodiment, interconnection devices, such as connectors, jumpers, and discrete wires, are eliminated from the printed circuit board 12. Under the present invention, it is possible for one printed circuit board 12 to receive external control data, control internal subcircuits, monitor subcircuit health, and transmit health status over an external line without the addition of discrete wires to distribute circuit signals.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A power amplifier comprising:
    a single circuit board having a plurality of subcircuits, including a high power gain subcircuit, thereon;
    the circuit board comprising multiple conductive layers including a first signal distribution layer, a second ground plane layer, a third signal distribution layer, and a fourth conductive layer separated from the third signal distribution layer by a dielectric layer and defining a fourth ground plane layer, the layers embedded in the circuit board, the second ground plane layer disposed between the first and third signal distribution layers, and the fourth ground plane layer being substantially metallized;
    the subcircuits including components mounted on the first signal distribution layer and controlled impedance circuits used for operation of such components, the second ground plane layer completing the controlled impedance circuits;
    a chassis body and a lid structure for coupling with the chassis body to contain the circuit board, the chassis body having a main surface formed thereon for mounting the circuit board;
    the substantially metallized fourth ground plane layer of the circuit board coupling directly with the main surface of the chassis body to provide a ground reference to the circuit board, the second ground plane layer being directly coupled with the fourth ground plane layer for providing proper grounding and shielding of the subcircuits;
    a plurality of walls integrally formed with the lid structure and extending from the lid structure and disposed for surrounding the subcircuits to electrically isolate the subcircuits from one another on the circuit board.

2. The power amplifier of claim 1 wherein said walls form cavities for containing said subcircuits.

3. The power amplifier of claim 1 wherein the circuit board includes a ground path formed along a surface of the board, the wall coupling with a portion of the ground path for grounding the wall and the lid structure.

4. The power amplifier of claim 3 wherein said ground path is shaped to surround a portion of a subcircuit, the wall having a shape generally corresponding to the shape of the ground path.

5. The power amplifier of claim 1 wherein the multiple conductive layers are separated by dielectric layers, the first conductive layer being coupled to components of the subcircuits.

6. The power amplifier of claim 1 wherein the third signal distribution layer is separated from the second ground plane layer by a dielectric layer and is configured for distributing signals across the circuit board and between subcircuit components.

7. The power amplifier of claim 1 wherein said lid structure includes component clearance areas adapted to provide clearance for components of the subcircuits.

8. The power amplifier of claim 1 wherein said chassis body includes a least one coupling channel formed therein to allow coupling connections between subcircuits.

9. The power amplifier of claim 1 wherein the wall includes a pathway formed therein for connecting subcircuits together.

10. The power amplifier of claim 1 further comprising a gasket coupled to said wall for further isolating the subcircuit.

11. The power amplifier of claim 1 wherein the chassis body includes at least one channel adapted to contain at least one subcircuit extending downwardly from the circuit board.

12. A method of isolating subcircuits of a power amplifier comprising:

positioning a plurality of subcircuits, including a high power gain subcircuit, on a single circuit board;

the subcircuits including components mounted on the first signal distribution layer and controlled impedance circuits used for operation of such components;

distributing signals to components of the subcircuits through a first signal distribution layer and between the subcircuits with a third signal distribution layer wherein the signal distribution layers are embedded in the circuit board;

providing a second ground plane layer between the first and third signal distribution layers, the second ground plane layer completing the controlled impedance circuits; and providing a fourth ground plane layer separated from the third signal distribution layer, the fourth ground plane layer being substantially metallized;

mounting the circuit board in a chassis body having a main surface;

coupling the substantially metallized fourth ground plane layer of the circuit board directly with the main surface of the chassis body to provide a ground reference to the circuit board, and directly coupling the second ground plane layer with the fourth plane ground layer for providing proper grounding and shielding of the subcircuits;

positioning a lid structure having a plurality of walls integrally formed with the lid structure and extending therefrom over the circuit board such that the walls surround the high power gain subcircuit and electrically isolate the subcircuits from another.

13. The method of claim 12 further comprising forming an isolation ground path along a surface of the circuit board and coupling the walls with at least a portion of the isolation ground path for grounding the wall and the lid structure.

14. The method of claim 12 further comprising shaping the isolation ground path to generally follow the shape of the walls surrounding the subcircuits.

15. The method of claim 12 further comprising coupling a gasket to walls surrounding the subcircuits for further isolating the subcircuits.

16. The method of claim 12 further comprising positioning a power supply subcircuit and a high power gain subcircuit on the circuit board and positioning them generally at opposite ends of the circuit board.

17. The method of claim 12 further comprising plating a perimeter of the single printed circuit board with conductive material.

* * * * *